(12) United States Patent
Dietrich et al.

(10) Patent No.: US 7,583,546 B2
(45) Date of Patent: Sep. 1, 2009

(54) APPARATUS AND METHOD OF OPERATING AN INTEGRATED CIRCUIT

(75) Inventors: Stefan Dietrich, Tuerkenfeld (DE); Peter Schroegmeier, Munich (DE)

(73) Assignee: Qimonda AG, Munich (DE)

( * ) Notice: Subject to any disclaimer, the term of this patent is extended or adjusted under 35 U.S.C. 154(b) by 151 days.

(21) Appl. No.: 11/855,859

(22) Filed: Sep. 14, 2007

(65) Prior Publication Data

US 2008/0304339 A1    Dec. 11, 2008

Related U.S. Application Data

(60) Provisional application No. 60/942,902, filed on Jun. 8, 2007.

(51) Int. Cl.
*G11C 7/00* (2006.01)

(52) U.S. Cl. .............................. 365/189.16; 365/189.05

(58) Field of Classification Search ............ 365/189.16, 365/189.05, 189.011
See application file for complete search history.

(56) References Cited

U.S. PATENT DOCUMENTS

| 2003/0185036 | A1 | 10/2003 | Gilton et al. |
| 2006/0250863 | A1 | 11/2006 | Nakai et al. |
| 2007/0053224 | A1 | 3/2007 | Happ et al. |
| 2008/0247216 | A1* | 10/2008 | Lamorey et al. ............ 365/148 |

* cited by examiner

*Primary Examiner*—Vu A Le
(74) *Attorney, Agent, or Firm*—Slater & Matsil, L.L.P.

(57) ABSTRACT

The method of operating an integrated circuit including the step of writing to a memory cell, which can assume a first and a second logical state and wherein a change from the second logical state to the first logical state lasts longer than a change from the first logical state to the second logical state, includes reading the logical state of the memory cell, changing, depending on the logical state of the memory cell read, the logical state to the first logical state or retaining the same in the first logical state and, depending on the logical state to be written, changing the logical state to the second logical state or retaining the same in the first logical state.

41 Claims, 7 Drawing Sheets

APPARATUS AND METHOD OF OPERATING AN INTEGRATED CIRCUIT

This application claims the benefit of U.S. Provisional Application No. 60/942,902, filed on Jun. 8, 2007, entitled "Improved Write Access to Memory Cells," which application is hereby incorporated herein by reference.

TECHNICAL FIELD

Embodiments of the invention relate to writing to memory cells.

DETAILED DESCRIPTION OF ILLUSTRATIVE EMBODIMENTS

With reference to the accompanying FIGS. 1-7, explanations and embodiments relating to the method of operating an integrated circuit including the step of writing to a memory cell and an integrated circuit having a memory cell for writing with the same to the memory cell are described.

Figure 1:
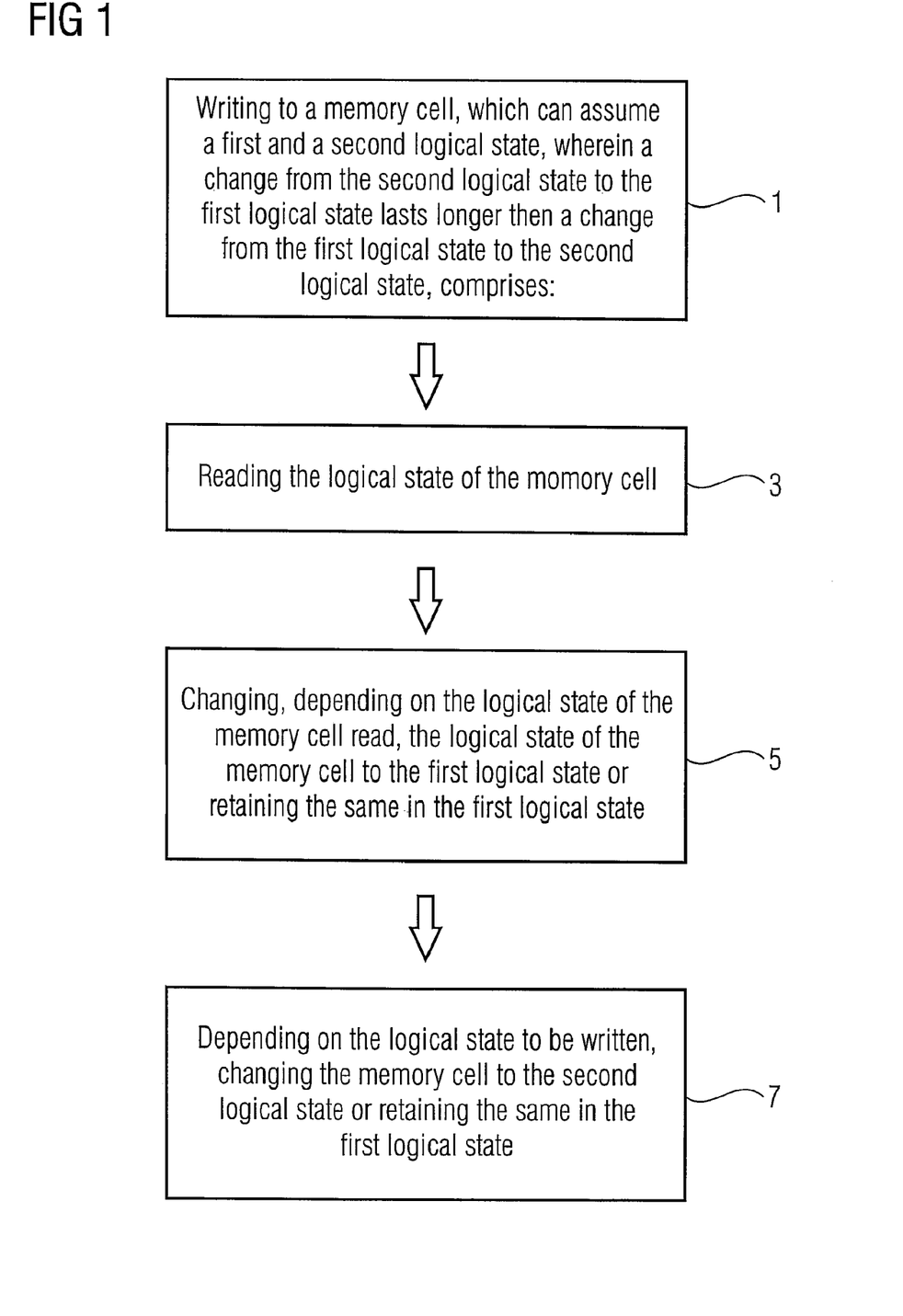
FIG. 1 shows a schematic flow chart of a method for writing to a memory cell according to an embodiment.

FIG. 1 shows a flow chart of a method of operating an integrated circuit including the step of writing to a memory cell. The method involves a memory cell in step 1 which can assume a first and a second logical state, wherein a change from the second logical state to the first logical state lasts longer than a change from the first logical state to the second logical state. Firstly, the logical state of the memory cell is read in step 3. Depending on the logical state of the memory cell read, the logical state of the memory cell is changed to the first logical state or retained in the first logical state in step 5. Depending on the data to be written, the logical state is then changed in step 7 to the second logical state or retained in the first logical state.

The steps shown in FIG. 1 focus on one memory cell. However, the steps may, in parallel, be performed for several memory cells. For example, in step 3, a predetermined plurality of memory cells are read such as, for example, a field of memory cells, and their content is stored or saved to be available at step 7. For example, their initial state read is buffered in a volatile storage element. In step 5, the predetermined plurality of memory cells are "prepared". That is, those memory cells which are already in the first logical state are retained therein, and the other ones are switched to the first logical state. The data to be written in step 7 can then be, for example, new data or the old data having been read out in step 3 and some of the data or all data being overwritten by new data. That is, before step 7, new data may have been written into a buffer into which the data read out in step 3 may have been saved. This overwriting may effect all memory cell's logical states or merely a part of it. Thus, in step 7, some of the memory cells are switched back to their initial state while others do not change their state relative to step 3.

By the preparation of the memory cells in step 5, data to be written may be written to the memory cells faster because only the time necessary for switching from the first to the second logical state has to be considered. The slower switching from the second to the first logical state may be hidden in a time preceding the receipt of the data to be written. Power may be saved by switching merely those memory cells to the first logical state which are not already in that state. Additionally, by saving and buffering the data read out before the preparation step, only a portion of the plurality of memory cells may be written to without losing the information of the other memory cells. Moreover, the buffer may be implemented as a volatile memory, and may be fast so that several write operations may be performed on the buffered data with a high frequency before performing step 7.

The memory cell or the plurality of memory cells can be part of or arranged in a memory array. For example, the memory cell or the plurality of memory cells may form a memory array so as to appear, act and react like a Dynamic-Random-Access-Memory (DRAM). Each memory cell may be connected to a selection or word line and to a sense or bit line. The memory cells can be arranged in a matrix, comprising rows and columns, wherein a plurality of memory cells connected to a word line form a row and memory cells connected to one bit line form a column (see also FIG. 5).

The memory cell or the plurality of memory cells can be arranged in an integrated circuit (IC) that may comprise logic circuitry. The circuitry can include, for example, one or more processors. More generally the circuitry may comprise a data processing unit. The unit may be a central-processor-unit (CPU) or a digital-signal-processor (DSP), for example. The circuitry may also include custom logic, application-specific-integrated circuits (ASIC) and/or logic gate arrays, for example. It is also feasible that the integrated circuit includes additional conventional memory devices, for example, DRAM memories, or conventional Flash-memory.

A memory cell may be formed by a memory element connected, on one side, to a first terminal of a switchable path of a selection transistor and, on the other side, to a certain potential, such as ground. The selection transistor, in turn, may have a second terminal of its switchable path connected to a sense line, whereas a control terminal of the selection transistor may be connected to a selection line. The memory element may be formed by a resistive element. However, the memory cells of interest here, are not restricted to resistive elements. Rather, the logical state of a memory cell may be represented by the resistance of a resistive element, by the magnetization of a magnetic element, by the capacitance of a capacitor or any element suitable for forming at least two stable logical states. The memory cell may be a non-volatile memory cell.

Memories, in which the memory cell is formed as a switchable or changeable resistor, for example, Conductive-Bridging Random-Access-Memory (CBRAM) or Phase-Change-Random-Access-Memory (PCRAM) typically have relatively long switching time for changing the logical state of the memory cell. In PCRAM, for example, the switching time from the high ohmic to the low ohmic state, called a SET process, may involve more than 150 ns and may take longer than the reverse process. For a CBRAM, the switching time from the low ohmic to the high ohmic state, called an ERASE process, may be also relatively long, i.e., longer than the reverse operation.

For applications, in which these memory types are to be operated as a replacement for a conventional Dynamic-Random-Access-Memory (DRAM) leads to problems because the specification of conventional DRAMs prescribes that a memory cell should be written within a column access. For a typical DRAM operating frequency of about 200 MHz, for example, a switching time between the logical states of the memory cells of less than 5 nanoseconds would be desirable. The following embodiments partially address this problem. However, these embodiments may easily be transferred to other applications than DRAM substitutes, and accordingly, these embodiments are neither restricted to PCRAM nor to CBRAM and are not restricted to DRAM timings.

To replace a DRAM with a memory comprising such memory cells, a DRAM-like operation would be necessary. A DRAM-like operation means, for example, that in the memory a complete page is read out upon activation of a row by applying an activate command. According to following embodiments, the reading is realized by read circuits, such as on pitch voltage amplifiers or sense amplifiers. "on pitch" means that each column address has an amplifier of its own associated therewith, i.e., at a page length of n, there are n amplifiers working in parallel. For reading memory cells, comprising a resistive element with the aid of voltage amplifiers, a voltage difference on an active bit line and an adjacent bit line used as a reference, may be amplified to the difference between the memory area operating voltage and ground.

Figure 2:
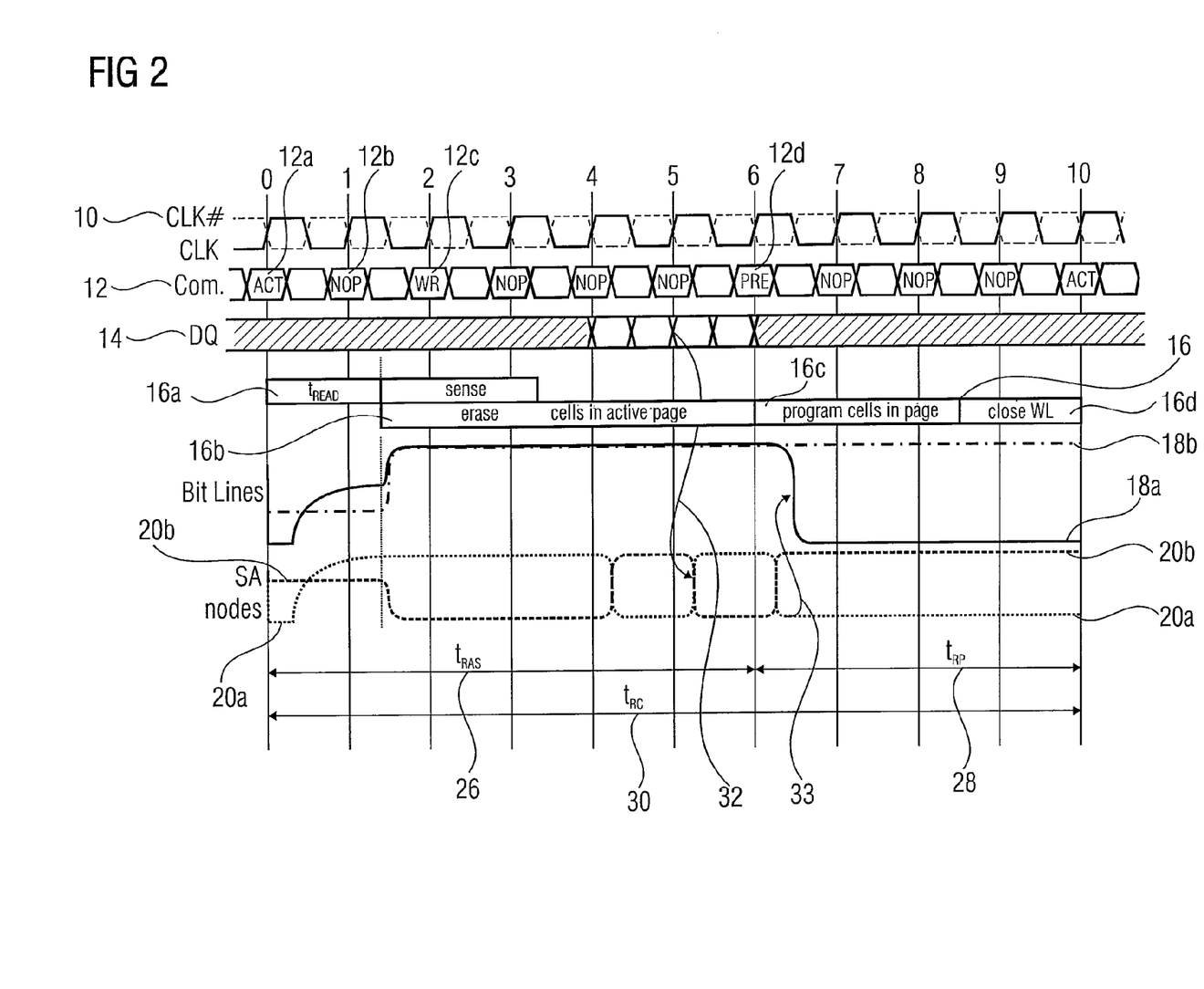
FIG. 2 shows a timing diagram for a hidden-write access, for a Conductive-Bridging-Random-Access-Memory (CBRAM) according to an embodiment.
Figure 3:
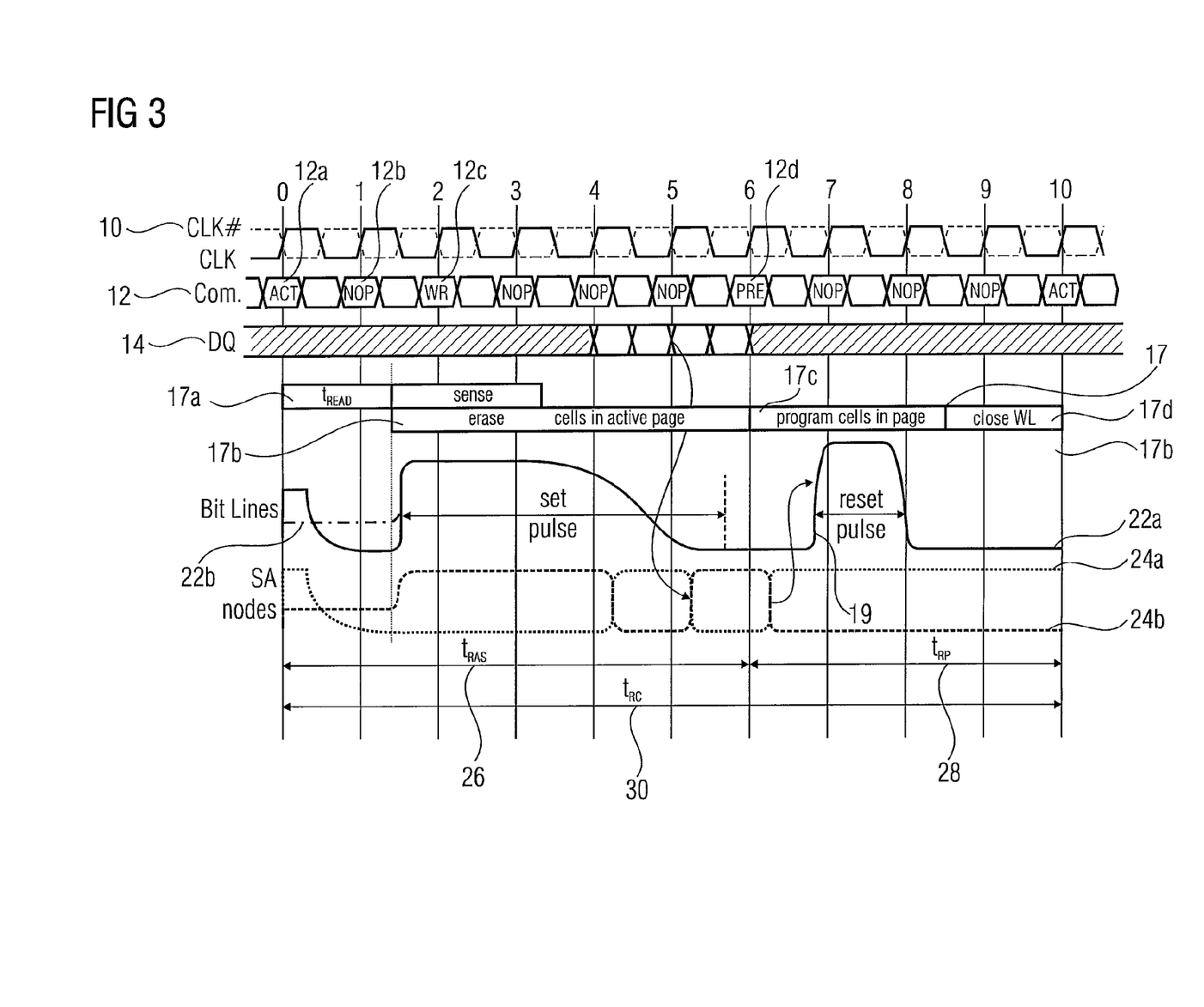
FIG. 3 shows a timing diagram for a hidden-write access for a Phase-Change-Random-Access-Memory (PCRAM) according to an embodiment.

In the subsequent description of the timing diagrams in FIGS. 2 and 3, the memory device is assumed to be a CBRAM in case of FIG. 2 and a PCRAM in case of FIG. 3, respectively. Further, it is assumed that the memory device comprises sense amplifiers assigned to groups of memory cells, which can be connected or disconnected by, for example, a switch to/from the memory cells. Moreover, the following description of FIGS. 2 and 3 is based on the assumption that the memory device comprises a control circuit which is configured to control the switch and to initiate control commands for reading and writing to the memory cells. The control circuit may be furthermore configured to open the switch to electrically disconnect the memory cell from the sense amplifier and to close the switch again, upon a precharge command, to connect the memory cell and the sense amplifier. Although these assumptions ease the understanding of the following description it is to be noted that other implementations are also possible.

Referring to FIG. 2, a method of operating an integrated circuit including the step of writing to a memory cell of a CBRAM is explained with a timing diagram comprising a differential clock signal 10, with a positive clock and a respective negative clock. The time diagram comprises 10 periods of the differential clock signal 10 enumerated with 0-10. Furthermore, a command sequence line 12 is depicted, comprising an activate command (ACT) 12a, a non-operation command (NOP) 12b, a write command (WR) 12c and a precharge command (PRE) 12d. The data to be written to the memory cell is shown in the data line 14. Line 16 depicts the key words of the respective operations and shows their duration. In detail the read operation 16a, the simultaneous sensing and erasing of cells 16b, the programming of cells 16c upon a PRE command 12d and finally the closing of the activated wordline 16d are shown. The voltage or signal level of the bit line is shown for two cases. Case 18a relates to the case where, depending on the data to be written 32, the logical state of the memory cell is changed 33 to the second logical state—that is, in case of the CBRAM, to the low ohmic state, and where a so called SET operation is performed. Curve 18b shows the bit line level for the other case if, depending on the data to be written, the logical state of the memory state will be retained in the first logical state. For both cases 18a, where the memory cell is changed to the second logical state and 18b, where the memory cell is retained in the first logical state, the situation at the sense amplifier (SA) is depicted in curves 20a and 20b, respectively. The curve 20a shows the voltage level at the sense amplifier, if the logical state to be written to the memory cell, is the low ohmic state. The curve 20b shows the voltage level at the sense amplifier, if the logical state to be written to the memory cell is the high ohmic state. The time interval $t_{RAS}$ 26 depicts the so-called row access strobe time, which indicates, in terms of DRAM timing characteristics, the time between an activate command and a precharge command. Furthermore, the time interval $t_{RP}$ 28 may be called the row precharge time and indicates, in terms of DRAM timings, the time which is needed in order to precharge the bit lines. The time intervals $t_{RAS}$ 26 and $t_{RP}$ 28 form the time interval $t_{RC}$ 30, the so-called row cycle time, which indicates in terms of DRAM timings, the minimum time between two activate commands.

For the CBRAM, the high ohmic state may represent the above-mentioned first logical state whose respective voltage level is more difficult and time consuming to achieve than the low ohmic state which, in turn, may be associated with the second logical state. The ERASE operation, i.e., the change of the CBRAM's logical state from the low ohmic state to the high ohmic state, is more difficult to assume because of a high voltage, which may be applied to a low ohmic cell. The change is therefore level critical.

A DRAM-like writing to such a CBRAM cell when viewed from outside, can be achieved as described in the following. After applying an ACT command 12a, a memory cell or a plurality of memory cells connected to a word line, such as a page, are selected and the present logical state of the respective memory cells are read out via the respective bit lines connected to the associated sense amplifiers. The logical state may now be amplified in the sense amplifier, wherein, after amplifying the present logical state, the sense amplifier and the bit line are disconnected. In conventional DRAM technology, high voltages present at the memory cells restore the charges of the memory cells. High voltages to resistive memory cells such as they are contemplated in the present embodiment, however, cause stress for the cells, i.e., damage the memory cells. Accordingly, disconnecting the amplifier from the bit line following the amplification process enables reducing the stress applied to the cells. According to some of the embodiments, this effect is exploited for realizing the write access.

In DRAM technology, with applying an ACTIVATE command, a row address is selected and the respective memory cells are read out into the respective amplifiers. Since amplifying of the small signals of the DRAM memory cells takes some time, the row access time conventionally is longer than the column access time. After applying an ACT command 12a, a NOP command 12b and a WR command 12c may follow. Just after employing the write or respective read command, the column address is submitted and, therefore, the column access can start.

According to an embodiment, the above requirement to emulate a DRAM performance by use of a non-volatile memory is copied in the following way. All memory cells of a selected page are read out after receiving an ACT command in the associated sense amplifiers. Afterwards, the sense amplifiers may be electrically disconnected from the bit line and the memory cells. After the disconnection, the column access, which has to be performed in a short time period, with the data to be written to certain column addresses of the activated pages is performed by accessing the disconnected sense amplifiers rather than the memory cells itself. The data read from the memory cells to which no write access takes place may remain in the respective sense amplifier unchanged. The bit lines and, therefore, the memory cells remain disconnected as required. Thus, both read and write accesses to certain addresses on the activated page can be performed in exactly the same way and, in particular, with the same frequency as in DRAM. In other words, at this stage of the write access, the data 14 to be written is written to the respective sense amplifiers of the activated page only. The memory cells are not influenced by the data. This is shown by the curves 20a and 20b illustrating the logical state change within the sense amplifiers. The curves 20a and 20b depict the voltage level at the sense amplifier node depending on the logical state to be written to the respective memory cell. The exact column address for a subsequent write access which is triggered by a write command 12c is then known.

Within the preparation step, all memory cells of the activated page are changed to, in the case of the CBRAM, the low ohmic state. This is done by transferring these memory cells into the low ohmic state. However depending on their present logical state having been read out and temporarily saved, only such memory cells are changed to the first logical state which were not already in the first logical state. Memory cells that already comprise the first logical state are retained in the first logical state, i.e., no write operation is performed to such memory cells, and thereby, no power is consumed for these cells. That is, directly after separating the sense amplifier and the bit line from each other to disconnect the memory cells, all memory cells of the activated page, which are not comprising the first state are overwritten so that they assume the first logical state. Such memory cells of an activated page which are already comprising the first logical state are retained in the first logical state. Because of the separation of the sense amplifier from the memory cell connected to the bit line leading to the sense amplifier, the hidden-write access to the memory cells can be performed in parallel to the sensing of the sense amplifier and the respective write access to the sense amplifier, as described in 16. This parallel operating is schematically shown in the time interval 16b depicting sensing and erasing at the same time. After performing this operation, all memory cells of the activated page are "erased" and therefore comprise the first logical state. The available time for reading and erasing of the memory cells which are not already comprising the first logical state is $t_{RAS}$ 26. The result of the reading of the logical state can be used to decide which of the memory cells are to be changed from the current logical state to the first logical state, and which may be left unchanged because they already comprise the first logical state. In order to decide which memory cells are already comprising the first logical state, the read out may involve a comparison of the memory cell state with a reference signal. The reference signal can be equivalent to a first or a second logical state. The comparison can be, for example, performed with a comparator unit, which can distinguish if a logical state in a memory cell is different from a reference state.

After the completion of all column operations, a row precharge (PRE) command 12d may be performed in order to close the activated page. During the respective time interval $t_{RP}$ 28, which is shorter than the time interval $t_{RAS}$ 26, the second part of the write operation may be inserted. It is recalled that the data read out to the sense amplifiers at the beginning of the write access may be data still being stored therein or data having been read out from the respective memory cells and having been overwritten by new data to be written to the memory cells. Before the selection transistor is closed, the connection between the sense amplifier and the bit line with the coupled memory cell is reestablished, whereby the following situation for the CBRAM may result.

One side of the memory cell, such as, for example, the anode, comprises a voltage VPL>0. As described above, after applying the ACTIVATE command, an ERASE operation is performed at the end of which the cell is high ohmic. The bit line is set to VPL at the end of the ERASE process (see curve 18a, b in FIG. 2). The voltage difference in the associated differential sense amplifier amounts to VPL-ground voltage. If the data finally to be written to the memory cells, is of the high ohmic state, that is, the cell is to be erased following the PRECHARGE command, the bit line voltage is VPL corresponding to the state of the sense amplifier after the last write process. Therefore, the voltage across the cell is 0 volt and no ERASE operation is triggered. Hence, the memory cell is not stressed. By means of the first write at the beginning, the cell is already in an erased state, so that the aim has been achieved by the preceding hidden-write access.

When, according to the data to be written, the memory cell is to be programmed (SET operation), that is, the cell shall assume the low ohmic or the second state, then the bit line voltage given by the state of the sense amplifier after the last write process 20a, is ground. Therefore, the voltage across the memory cell is VPL, and a programming operation is triggered, in order to change the logical state of the memory cell from the first to the second logical state. Only necessary memory cells will be overwritten.

The buffer or sense amplifier is able to store the data read at the beginning of the write access at least until a precharge command is performed so that the logical state of a memory cell to which no new logical state had to be written, comprises again its correct logical state after connecting the buffer with the respective memory cell and writing back the respective logical state, depending on the logical state stored. That is, memory cells of column addresses of a page to which no external write access takes place comprise again their initial logical state after finishing the complete write access.

As described above, the column access, which may be performed within a small time budget may be restricted to an interface portion extending to the sense amplifier inclusively. After reading the present logical state of a memory cell, the sense amplifier and the bit lines may have been disconnected. Thus, both read and write accesses on the activated page can be performed in exactly the same way, i.e., by accessing the sense amplifier's buffer, and, in particular, with the same frequency as in DRAM.

At the same time, i.e., during the above-mentioned read or write access to the sense amplifier's buffer, or directly after the bit lines have been disconnected, a write access may be triggered or prepared. For example, all memory cells are switched to a predetermined state allowing a faster change to the other state than vice versa. In particular, merely those cells may be involved in the trigger or preparation process, not already comprising the first logical state. The latter memory cells may be determined by use of the result of the read out preceding the disconnections of the bit line from the sense amplifier, such as by a comparison of the logical states of the memory cell's read out result by use of associated comparator units.

The memory cells involved in preparation are switched from a current state to the predetermined state, a process more time consuming and/or level critical to be attained than the reverse process of switching the cells from the predetermined state to the other state. For CBRAM, the more time consuming state change is ERASE, according to which a high voltage level has to be applied to a low ohmic cell, which can be difficult to assume the respective voltage level.

With PCRAM, this more time consuming process is SET, which may require, for example, more than 150 nanoseconds, which may be time critical. In FIG. 3, a method for writing to a memory cell is shown for a PCRAM. The timing diagram in FIG. 3 shows, similarly to FIG. 2, a differential clock 10, and a command line 12 with the respective ACT command 12a, NOP command 12b, WR command 12c and a PRE command 12d. Furthermore, the voltage level on the bit line for both above-mentioned cases 22a and 22b is shown. The voltage level of the sense amplifier nodes is indicated with the respective two curves 24a and 24b corresponding to the two possible logical states to be written to the memory cell. Apart from that, the timing interval $t_{RAS}$ 26, the timing interval $t_{RP}$ 28 and the timing interval $t_{RC}$ 30 are shown. The time line 17 with the key words describes the actual performed operation and their duration, that means the read operation 17a, the simultaneous sensing and setting of cells 17b, the resetting of cells 17c upon a PRE command 12d and the closing of the word line 17d.

For the PCRAM, there exist, again, two write accesses, SET and RESET, wherein the SET operation is more time consuming, that means it takes a longer time to bring the PCRAM in a low ohmic, e.g., crystalline state than the reverse RESET operation. After applying a SET operation, a PCRAM memory cell may comprise a lower ohmic state than after applying the RESET operation which, in turn, may lead to a high ohmic state of the memory cell. That is, in the case of the PCRAM, the above-mentioned first logical state corresponds to the low ohmic state which can be achieved by applying a SET operation to the memory cell.

As described in FIG. 3, after applying an ACT command 12a, which may be followed by a NOP command 12b and a subsequent WR command 12c, the memory cells are read out to a buffer which may be, again, a differential sense amplifier. After reading the content of the memory cells, the sense amplifiers are disconnected from the associated bit lines. Accordingly, on the one hand, the column access, which may be performed within a small time period and is therefore time critical can be restricted to an interface portion of the PCRAM extending to the sense amplifier inclusively, and all memory cells can be switched to the predetermined in parallel, i.e., in the case of the PCRAM, the low ohmic state, by applying a SET operation. This is schematically shown at 17b. In particular, the preparation step may be restricted to memory cells which are not already comprising the first logical state. That is, the first logical state is written to only these memory cells which, in turn, are changed by this SET operation to the first logical state. The memory cells thus to be prepared may be determined by use of the result of the read out before the disconnection of the bit lines from the sense amplifier, such as by a comparison of the logical states of the memory cell read out in associated analyzing circuits or comparator units. The other memory cells, i.e., those already assuming the first state, may be left unchanged and no superfluous write operation is performed on these memory cells. As already described above, this first hidden-write access to the memory cells can be done in parallel to the time critical column access which is restricted to the sense amplifiers. After the preparation operation, the entire memory cells of a page are in a "monochrome" state, i.e., the predetermined state. That is, the content of all memory cells of the page comprise the same logical state. The relevant time for this operation is indicated by $t_{RAS}$ 26.

After the completion of all column operations, a row precharge command 12d closing the activated page may be triggered. Then, the second less time consuming or with a voltage level less difficult to assume, write access may be started. Before a selection transistor for the memory cells may be closed on the page, the connection between the sense amplifier and the bit line is reestablished again. The anode of the memory cells may lie at ground. Following the ACT command 12a, a SET operation, possibly for the entire page, was performed. The bit line is set to ground after completion of the SET process. Therefore, the voltage difference of the two sense signals in the differential sense amplifier is V-ground, wherein V>0 may apply.

When a SET operation is to be performed after the PRECHARGE command 12d, the bit line voltage, given by the state of the sense amplifier after the last write process, is ground. The voltage across the cell, thus, is 0 volt and no SET operation is triggered and the cell will also not be stressed. Through the first write at the beginning, the cell already is in a SET state, the first logical state or the state, which is more time consuming to achieve or more difficult to achieve the respective voltage level, and the aim has been achieved. When a RESET operation 17c is to be performed on the cell, the bit line voltage given by the state of the sense amplifier after the last write process 24a, amounts to V. Accordingly, the voltage across the memory cell is V and a RESET current during a RESET pulse 19 may flow to change the memory cell from the first logical state, i.e. the SET state, to the second logical state, i.e. the RESET state. The time which is available for the second write access is $t_{RP}$ 28.

The described write access may comprise changing only cells, which are not comprising the first state into the second state, thereby preparing a write command. The memory cells may be stressed less because no voltage/current flow is present for those already comprising the first state. Moreover, it is feasible that a column access may be performed 100% compatible with DRAM specification. In particular, the timings may be chosen equally critical, with respect to respective timing periods. The more time consuming writing, i.e., SET, in case of PCRAM, and ERASE in case of CBRAM, may be displaced into row time domains which typically are specified less critically with respect to certain timings than column time domains. In other words, through the subdivision of the write access, the more time consuming or voltage level critical operation may be associated with the longer time ($t_{RAS}$), the less time consuming or voltage level critical one with the shorter one ($t_{RP}$). For example, there are two writing accesses in CBRAM, namely ERASE and PROGRAM, and in PCRAM, there are SET and RESET. In either case, one of the two is more difficult to perform, respectively time consuming to achieve and/or comprising a voltage level, which is difficulty to assume. During the actual write access, after the preparation of the memory cells, memory cells that are not to be written because they already have the right value, i.e., are in their predetermined state, and do not have to be stressed. That is, no voltage drop/current flow is present. Since the sense amplifier flips during the column access, each bit in the sense amplifier may be automatically correct when closing the page. The sense amplifier can be used without alteration in order to write its value into the cell. On the one hand, a page access may contain any number of column accesses to a column address. On the other hand, every cell may be written to maximally twice within a page access, which increases the life of the memory cells and increases the write endurance, respectively.

In other words, an embodiment for operating an integrated circuit including the step of writing involves, displacement of the more time consuming write operation in, for example, resistive memory cells with voltage sense amplifiers into the less time consuming row time domain. Moreover, an unchanged column access as compared with DRAM with separating the sense amplifier and the bit line and using the sense amplifiers as a buffer memory may be possible. The read data of a memory cell may be compared, whether the stored logical state is the time consuming one to achieve or not, and preparing the write access by writing, based on a comparison, the first logical state only to such cells of the activated page, comprising the second logical state. An embodiment for a write access involves, furthermore, dividing the write access into differentially time consuming and/or voltage level critical accesses, which are separated temporarily, i.e., the preparation process and the following reversing process. Furthermore, the memory cells are preserved because of less stress and an improved endurance, by writing at the end of the page access. As described above, the hidden-write may involve an evaluation of the read value of a cell after reading the same, in order to decide whether the ERASE or SET process has to be performed for this memory cell. By this measure, cells already in the ERASE or SET state do not have to be newly written, thereby may result in current/power savings and less stress for the memory cells.

That means changing only such memory cells to the first logical state which are not comprising already the first logical state, may result in the memory cells being, on average, less stressed. In order to change the logical state of the memory cell, a high voltage may be, for example, applied to the memory cell, which can cause stress for the memory cell. That means that the endurance of the memory cell may be prolonged. Additionally, the power consumption of the access may be reduced, since not all cells have to be changed, depending on the initial memory content of the memory cells.

In accordance with a further embodiment, writing a logical state in a plurality of memory cells of a memory apparatus, connected to a select line and a sense line, respectively, is accomplished in the following way. Each memory cell may assume one of two or more logical states, wherein writing a first state to a memory cell takes time a t1, which is longer than a time t2 needed to write another logical state in the memory cell. The writing process comprises reading out the logical state of a plurality of memory cells, comparing the logical state of each memory cell with a logical reference state in associated comparators, writing, based on the result of the comparison, the first state to memory cells not already being in that state and writing, based on the data to be written and/or the result of the comparison, memory cells to another logical state other than the first state.

According to a further embodiment, a memory cell can assume one of two logical states, a first and a second logical state, wherein a change from the second logical state to the first logical state in the memory cell takes a longer time than the change from the first logical state to the second logical state. The reading may be performed by means of reading circuits, such as sense amplifiers, each of which is connectable and disconnectable to/from a respective subset of the memory cells by means of a respective switch, such as a transistor and serves as a memory buffer. After reading the logical states of a plurality of memory cells, the results of this reading is used to decide, which of the memory cells are to be changed from the current logical state to the first logical state and, which may be left unchanged because they already assume the first logical state, and the change of the respective memory cell is performed. This may involve opening the aforementioned switches to disconnect electrically the memory cells from the reading circuits during state changes. In other words, depending on the logical state already stored in the memory cell as obtained in reading the memory cells, all memory cells assume the first state. After the memory cells have been such prepared, new data to be written may be used to change or overwrite data buffered outside the memory cells, such that read out from the memory cells and residing in the aforementioned read out cells. The data to be written may be collected in several write commands. Also, within the data buffered, the buffered state of a certain memory cell may change more than one time before the buffered data is written back to the memory cells. The change or overwriting may be transferred to the memory cells by writing the changed or overwritten data to the memory cells. Again, evaluation of the changed or overwritten data or the data used to change or overwrite or the data unchanged, read and stored may be used to restrict the second write process to those memory cells, which have to assume another memory state other than the first memory state, according to the data currently buffered outside the memory cells. Again, the second write process may involve connecting the memory cells with the read out circuits respectively.

According to another embodiment, a plurality of memory cells may be arranged in a page, wherein this page in turn may consist of several segments with a certain number of memory cells and wherein writing to the memory cells may be performed so that each segment of the page is written one after the other. Until a segment has been written to, a signal, for example, a busy signal, may be provided to a respective control circuit to indicate that the writing process for the segment is still ongoing. This can be done in succession for the various segments. If all memory cells of a segment comprise already the first logical state at the time the memory cells have to be prepared, none of them has to be changed to the first logical state and the signal can immediately indicate that the next segment can be written. Because of this, the overall time for writing this first state to the memory cells of a page comprising a plurality of segments, may be reduced.

It is also feasible to use one of the hidden-write concepts described herein also for so-called current mode sense amplifiers. Current sense amplifiers have a substantially larger layout than voltage sense amplifiers. This results in the fact that they may not be placed on pitch, and the bit lines belonging to a sense amplifier are read out sequentially, one after the other. The hidden-write concept may, however, still be used as described, after this sequential reading. But the DRAM timing, which determines the temporal distance between the activate command and the first possible column access, should be relaxed.

It is also feasible to use the hidden-write concept for other sense concepts, such as current-shift concept, for example.

Figure 4:
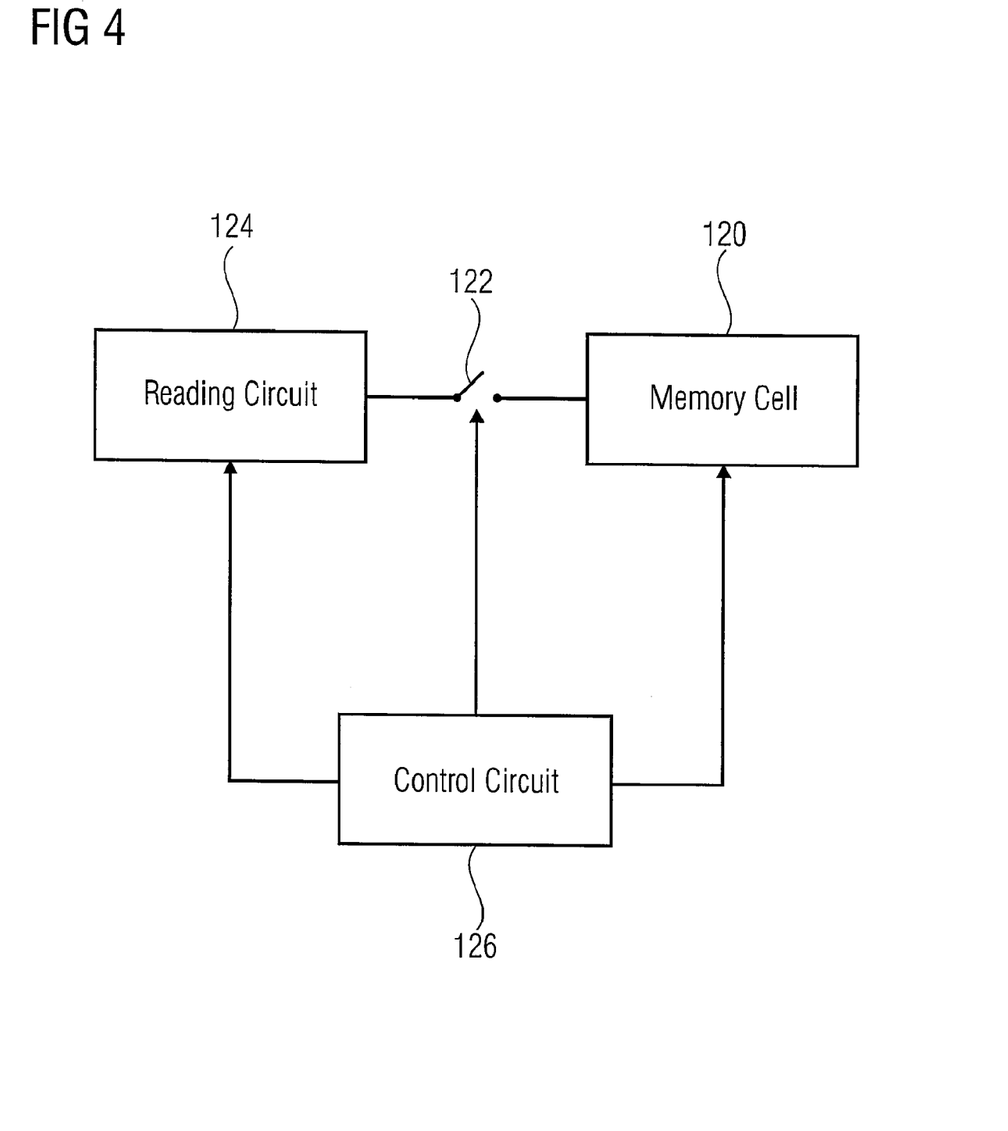
FIG. 4 shows a schematic block diagram of a memory device according to an embodiment.

FIG. 4 depicts a schematic block diagram of a memory device for writing to a memory cell. The memory device can comprise a memory cell 120 which is able to assume a first and a second logical state, wherein a change from the second logical state to the first logical state lasts longer than a change from the first logical state to the second logical state and a reading circuit 124, which can be connected, for example, by a switch 122, to the memory cell 120. Moreover, it can comprise a control circuit 126 which is configured to initiate, upon an activation signal, a change of the logical state of the memory cell 120 to the first logical state or retain the same in the first logical state, depending on the read logical state of the memory cell 120. The control circuit can furthermore change the logical state of the memory cell to the second logical state or retaining the same in the first logical state, depending on the logical state to be written. The reading circuit 124 or the control circuit 126 may comprise a comparator unit in order to analyze the logical state of the memory 120 and, based on the result, the control circuit 126 may change the logical state of the memory cell 120 to the first logical state or retain the same in the first logical state. The control circuit 126 may be furthermore configured to open, for example, upon an activation signal, the switch 122 to disconnect electrically the memory cell from the reading circuit and to close the switch again to connect the memory cell and the reading circuit. It is also feasible that a resetting circuit (not shown in FIG. 4) instructed by the control circuit 126 changes the logical state of the memory cell to the first logical state or retain the same in the first logical state, depending on the logical state of the memory cell read.

Figure 5:
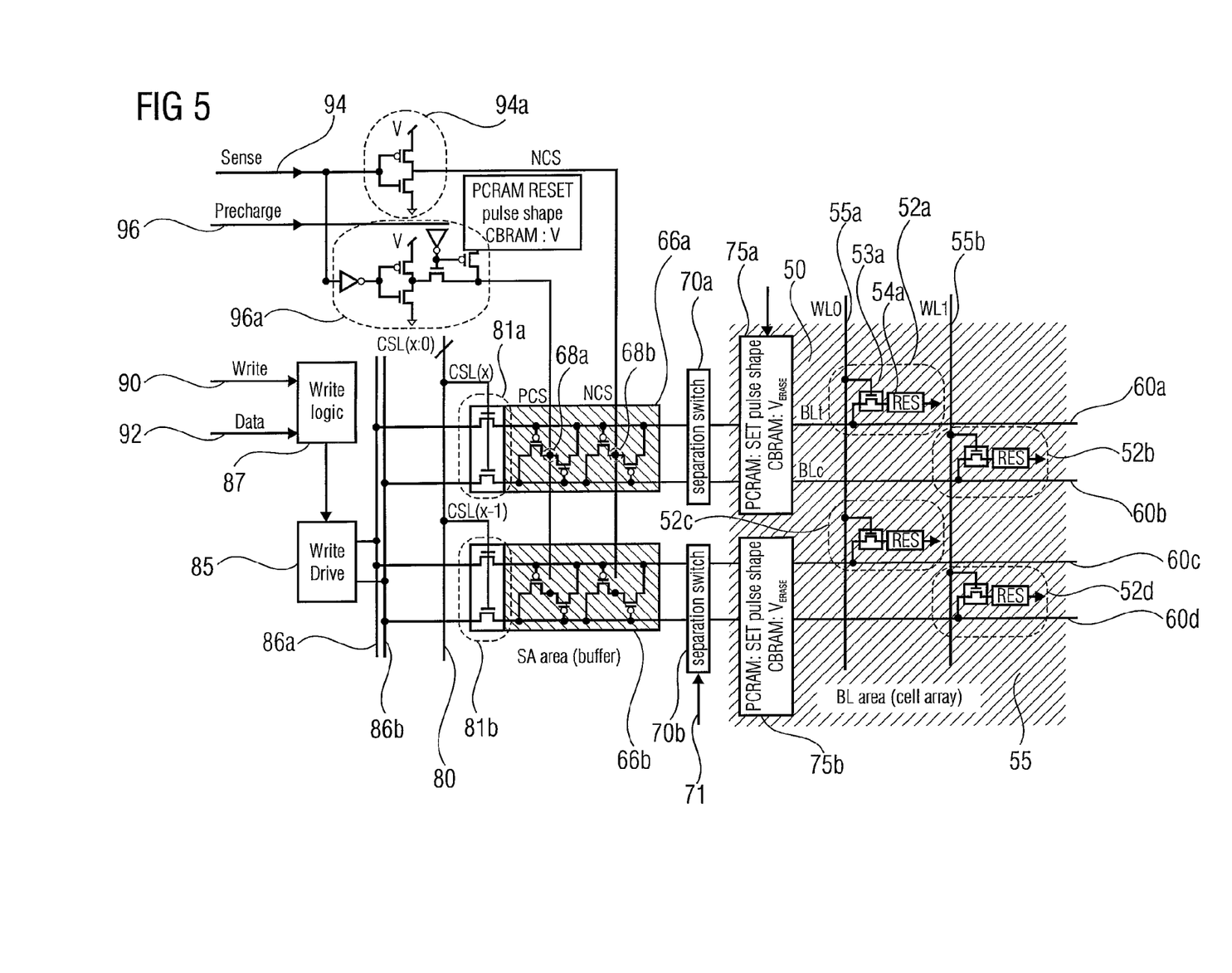
FIG. 5 shows a schematic electrical circuit of a memory device for writing to memory cells according to an embodiment.

In FIG. 5, a block circuit diagram, depicting a memory device for performing the method of operating an integrated circuit is exemplarily illustrated.

The exemplary memory device comprises a memory array 50 comprising a matrix which is formed by word lines 55a; 55b and bit lines 60a; 60b; 60c; 60d. The size or portion of the array 50 shown in FIG. 5 is merely an example and may be varied. Every memory cell 52a; 52b; 52c; 52d is connected to a word line and to a bit line. As it is exemplarily shown for the memory cell 52a, every memory cell may comprise a selection transistor 53a and a memory element 54a. The memory element 54b may be formed by a resistive memory element connected, on one side, to a first terminal of a switchable path of a selection transistor 53a and, on the other side, to a certain potential such as ground. The selection transistor 53a in turn may have a second terminal of a switchable path connected to the sense line, i.e. the bit line 60a, whereas a control terminal of the selection transistor 53a is connected to the respective selection line or word line 55a. Referring additionally to FIG. 2 and FIG. 3, the operation of the memory device will be explained in the following. After activating 12a a word line, the logical state of each of the memory cells connected to this word line is read out 16a; 17a to the respective differential sense amplifiers 66a; 66b and stored therein. For example, by activating the word line 0 (WL0) 55a, the logical state of the memory cells 52a and 52c is read out 16a; 17a via the bit lines 60a, respectively 60c to the respective sense amplifiers 66a and 66b. For sensing 16b; 17b, the differential sense amplifier needs two sense signals, wherein, for example, one signal is the bit line true signal (BLT) 60a; 60c and the other is the bit line complementary (BLC) 60b; 60d. In the above described example, the memory state of the memory cell 52a is read out by the sense amplifier 66a connected to the memory cell 52a via the bit line true 60a. The BLC of the differential sense amplifier 66a is connected to the memory cell 52b, which is not activated. The differential sense amplifiers 66a; 66b can be disconnected from the bit lines of the memory array by separation switches 70a; 70b. A control circuit 71 may control the separation switches 70a; 70b. After reading the memory cells of the activated page and disconnecting the sense amplifiers from the bit lines, simultaneously to the sensing in the sense amplifiers the hidden-write 16b; 17b, to change the logical state of the memory cells to the first logical state, can be performed as well by a control circuit. This is schematically illustrated by the boxes 75a; 75b, indicating that for a PCRAM a SET pulse 17b is performed and for a CBRAM an ERASE 16b operation is performed.

The sense amplifiers 66a; 66b may be conventional sense amplifiers, comprising cross coupled p- and n-channel Field-Effect-Transistors (FET), as well as a node 68a and 68b. The node 68a is connected to a control level potential source 96 (PCS), which may comprise circuits and amplifiers 96a, in order to generate a certain voltage. For the PCRAM, the SET pulse can be generated and for the CBRAM, the necessary voltage V. The node 68b is coupled to a controllable potential source 94 (NCS) for the sense signal, which comprises, for example, an inverter 94a.

An external write access 90; 12b, with respective data 92; 14, can be performed with a write logic 87, comprising a write driver 85, which is forwarding the data to be written, the two possible logical states via two connectable paths 86a and 86b to switches 81a, 81b to the sense amplifiers 66a and 66b. The switches 81a and 81b may be transistors, wherein the data lines 86a and 86b are connected to one terminal of the switchable path of the transistor 81a, 81b and they may have a second terminal of its switchable path connected to the respective sense amplifiers 66a, 66b. A control terminal of the transistors 81a to 81b may be connected to the so-called chip select line 80, which connects the data line 86a and 86b with the respective sense amplifiers, if the data have to be written to the associated memory cell. That means that the chip select line acts as an address selection line.

During a write access 12c, the data to be written to a certain address may be used to change or overwrite 32 data buffered in the sense amplifier and the data to be written may be collected in several write commands. The data read and stored in the sense amplifier at the beginning of the write access, after applying the ACT command may be kept in those sense amplifiers, if they are not overwritten by data of an external write access. Also, within the data buffered, the buffered state of a certain memory cell may change more than one time before the buffered data in the sense amplifier is written back to the memory cells. The change or overwriting may be transferred to the memory cells by writing the changed or overwritten data to the memory cells, after applying a precharge command 12d and connecting again the sense amplifier and the bit lines by the separation switch. The data of unchanged memory cells may be written back as well to the memory cells. Again, evaluation of the changed or overwritten data or the data used to change or overwrite or the unchanged data still stored in the buffer may be used to restrict the second write process to those memory cells, which have assumed another memory state than the first logical memory state according to the data currently buffered in the sense amplifier. The second write process may involve again connecting the memory cells with the read out circuits respectively and overwriting as described above only necessary memory cells. Afterwards the wordline, for example 55a, may be closed 16d; 17d.

The read out of the memory cells of an activated page in the beginning may involve a comparison of the memory cells logical state with the reference signal. The reference signal can be equivalent to a first or a second logical state. The comparison can be, for example, performed with a comparator unit or an analyzer circuit, which can distinguish if a logical state in a memory cell is different from a reference state. The comparator unit is not shown in FIG. 5, but may be connected to a control unit 71, which is performing the first hidden-write access, illustrated by the boxes 75a; 75b.

According to an embodiment, a memory device or a memory apparatus may comprise semiconductor elements or circuits, read out circuits, capable of comparing or evaluating the logical state of a plurality of associated memory cells. Based on the result of this comparison or evaluation, the first state, respectively the first logical state, will be written only to memory cells not already comprising the first logical state. The memory apparatus may comprise a plurality of memory cells capable of assuming and storing a first and a second logical state, wherein a change from the second logical state to the first logical state takes a longer time than a change from the first logical state to the second logical state. Separation switches may be connected between the read out circuits and the associated memory cells. A control circuit may control the separation switches as well as the overwriting of the buffered data in the read out circuits by use of the data to be written to control the above mentioned write procedure.

FIG. 5 is an exemplary block circuit diagram illustrating four memory cells are connected to voltage amplifiers by four bit lines, which are organized as two bit line pairs. The voltage supplies are designated with PCS and NCS. Separation switches may be coupled to voltage amplifiers from the bit line. The circuits for the first write access may be arranged in the bit line area, the second write access may be controlled globally.

The memory device with the memory cell or the plurality of memory cells can be arranged in an integrated circuit (IC) that may comprise logic circuitry. The circuitry can include, for example, one or more processors. The processor may be a central-processor-unit (CPU) or a digital-signal-processor (DSP). The circuitry may also include custom logic, that means, for example, application-specific-integrated circuits (ASIC) and/or a programmable gate logic (PAL), a Field-programmable-gate-arrays (FPGA), a complex-programmable logic device or a memory controller, for example. It is also feasible that the integrated circuit includes additional conventional memory devices, for example, DRAM memories or conventional flash-memory.

Figure 6:
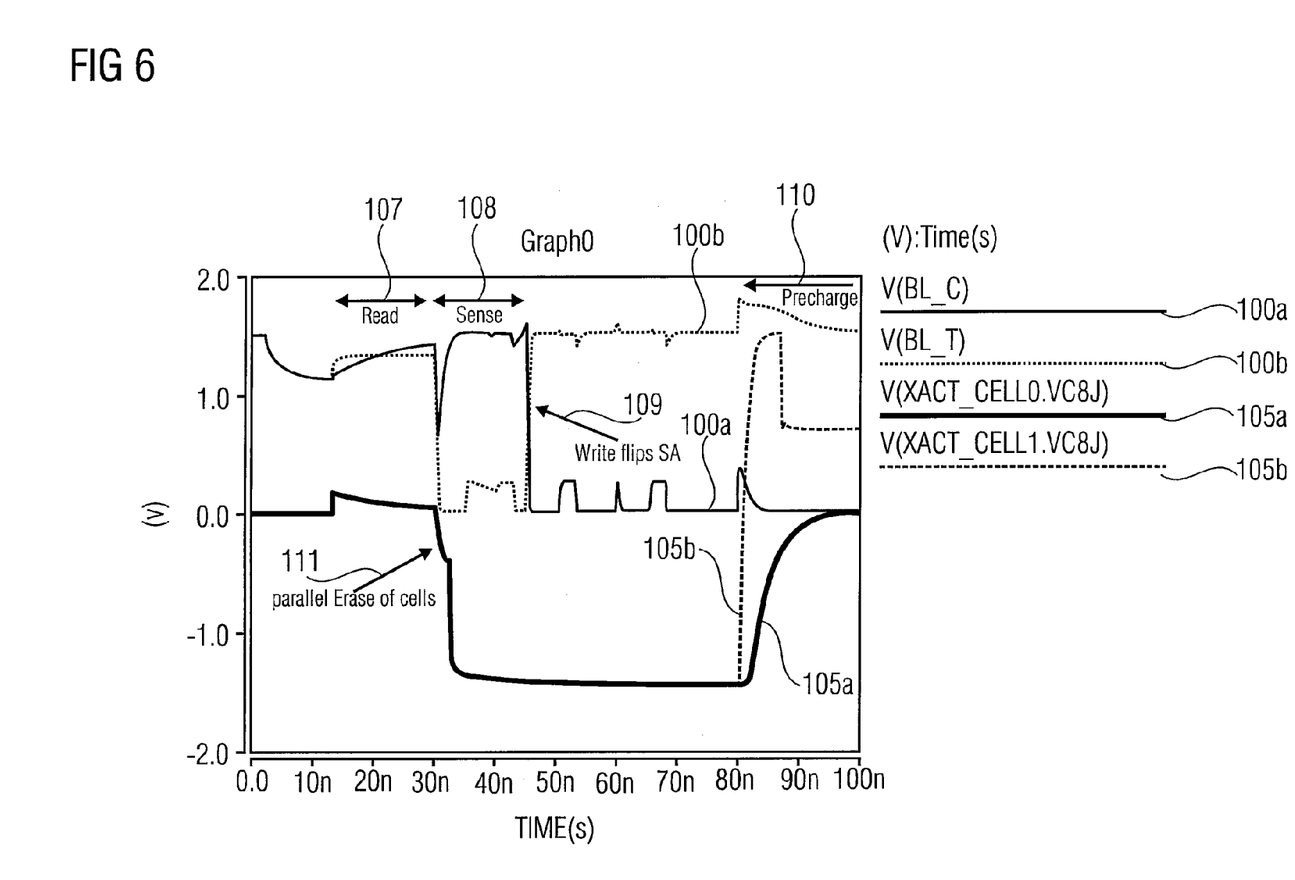
FIG. 6 shows a simulated timing diagram for a hidden-write access to a CBRAM according to an embodiment.

FIG. 6 exemplarily shows a simulation of the above mentioned hidden-write concept for a CBRAM. The voltage levels for the bit line complementary 100a, the bit line true 100b and across a memory cell to be written with a "0", as a logical state, 105a and a "1", as another logical state, 105b, are shown. The respective operations are read 107, sense 108, parallel erase of cells 111, flipping the sense amplifier by write 109, and precharging 110.

Figure 7:
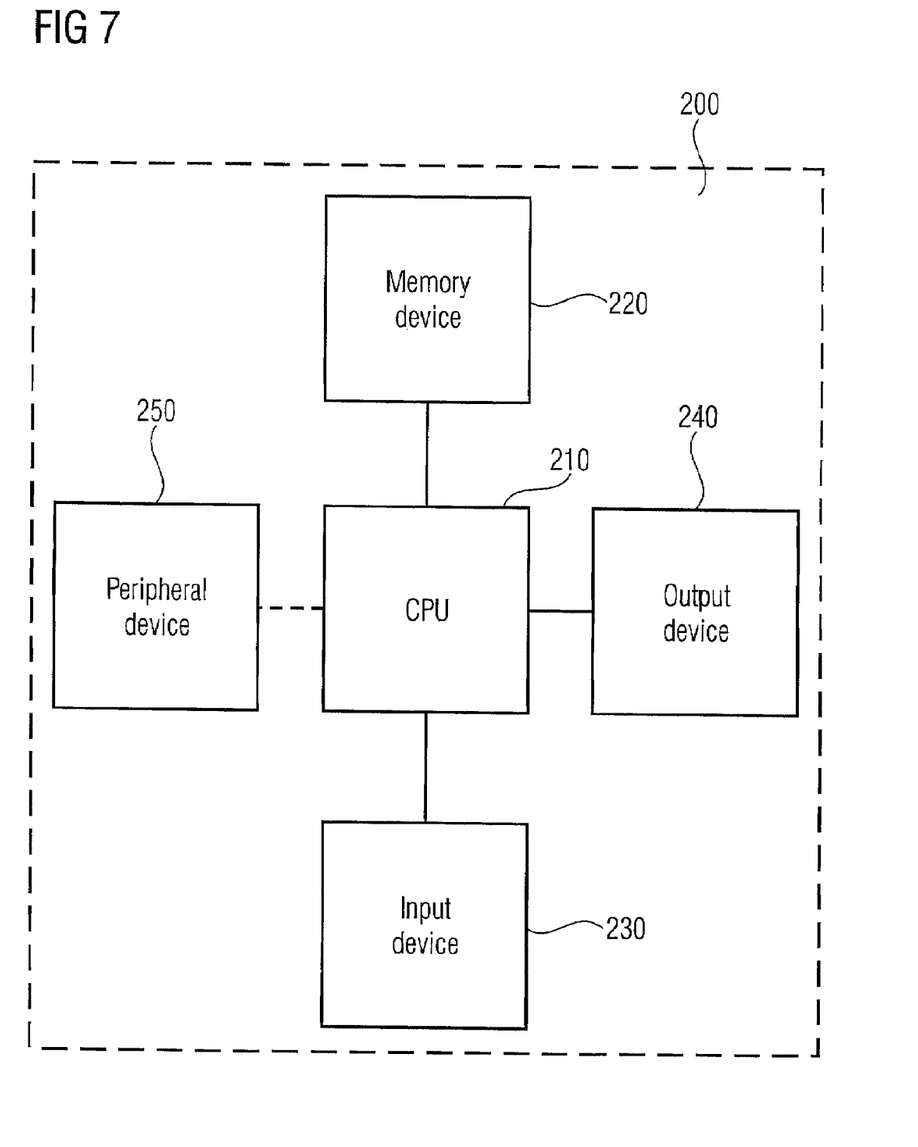
FIG. 7 shows a schematic drawing of a computer system according to an embodiment.

FIG. 7 shows a schematic block diagram of a computer 200 or a computer system comprising a central processing unit (CPU) 210, a memory device 220, an output device 240, an input device 230 and possibly a peripheral device 250. The memory device 220 may comprise a memory cell able to assume a first and a second logical state, wherein a change from the second logical state to the first logical state lasts longer than a change from the first logical state to the second logical state. Furthermore a reading circuit being connectable to the memory cell and a control circuit configured to cause a change of the logical state of the memory cell to the first logical state or a retainment of the logical state of the memory cell in the first logical state, depending on the logical state of the memory cell read, and cause a change of the logical state of the memory cell to the second logical state or a retainment of the logical state of the memory cell in the first logical state, depending on the logical state to be written.

It should be noted that in a typical case an embodiment of the invention may achieve savings of power, or time, or increased endurance, or a combination thereof.

The embodiments outlined with respect to the figures may also be applied to technologies, wherein a first amount of energy is used for a change from the second logical state to the first logical state and spending this first amount of energy results in a change taking a longer time than a change from the first logical state to the second logical state. But the technologies may enable a different configuration, wherein the time for a change from the second logical state to the first logical state spending a second amount of energy may take the same time than a change from the first logical state to the second logical state. Similar considerations apply for interchanging the first and the second state.

While the foregoing has been particularly shown and described with reference to particular embodiments thereof, it will be understood by those skilled in the art that various other changes in the form and details may be made without departing from the spirit and scope thereof. It is to be understood that various changes may be made in adapting to different embodiments without departing from the broader concepts disclosed herein and comprehend by the claims that follow.

What is claimed is:

1. A method of operating an integrated circuit including the step of writing to a memory cell which can assume a first and a second logical state, wherein a change from the second logical state to the first logical state in the memory cell takes a longer time than a change from the first logical state to the second logical state, the method comprising:
    reading a logical state of the memory cell;
    depending on the logical state of the memory cell read, changing the logical state to the first logical state or retaining the same in the first logical state; and
    depending on the logical state to be written, changing the logical state to the second logical state or retaining the same in the first logical state.

2. The method according to claim 1, wherein the method is performed on a plurality of memory cells assigned to a page of a memory device.

3. The method according to claim 1, wherein the reading comprises storing the logical state of the memory cell in an associated buffer.

4. The method according to claim 3, wherein the buffer comprises a sense amplifier.

5. The method according to claim 1, further comprising analyzing the logical state of the memory cell read.

6. The method according to claim 5, wherein the analyzing comprises comparing the logical state read with a reference state representing the first or the second logical state.

7. The method according to claim 5, wherein changing the logical state to the second logical state comprises, based on the analyzing of the logical state read, applying power to the memory cell to change the logical state to the first logical state, or applying no power to the memory cell to retain the same in the first logical state.

8. The method according to claim 3, further comprising decoupling the memory cell and the associated buffer.

9. The method according to claim 1, wherein changing the logical state to the first logical state or retaining the same in the first logical state takes place during a row access strobe time $t_{RAS}$.

10. The method according to claim 3, wherein the logical state stored in the associated buffer is overwritten by the logical state to be written to the associated memory cell.

11. The method according to claim 1, wherein the buffer is coupled to the memory cell upon receiving a precharging command from a memory control unit.

12. The method according to claim 1, wherein, depending on the logical state to be written, changing the logical state to the second logical state or retaining the same in the first logical state takes place during a precharging time $t_{RP}$.

13. The method according to claim 1, wherein the logical state to be written corresponds to the logical state of the memory cell read or to a logical state written upon an external write access.

14. The method according to claim 1, wherein the first and the second logical states are represented by resistance values of a resistive element or by magnetization values of a magnetic element or by capacitance values of a capacitive element.

15. The method according to claim 1, wherein the memory cell is a non-volatile memory cell.

16. The method according to claim 2, wherein the reading of the plurality of memory cells is performed in succession in units of segments.

17. An integrated circuit comprising:
a memory cell able to assume a first and a second logical state, wherein a change from the second logical state to the first logical state lasts longer than a change from the first logical state to the second logical state;
a reading circuit being connectable to the memory cell; and
a control circuit configured to cause a change of the logical state of the memory cell to the first logical state or a retainment of the logical state of the memory cell in the first logical state, depending on the logical state of the memory cell read, and cause a change of the logical state of the memory cell to the second logical state or a retainment of the logical state of the memory cell in the first logical state, depending on the logical state to be written.

18. The integrated circuit according to claim 17, further comprising a memory array formed in rows and columns of memory cells wherein the memory cell is one of the memory cells.

19. The integrated circuit according to claim 18, wherein each
memory cell comprises a selection switch via which the memory cells are connectable to a respective reading circuit, the selection switch being controllable via a word line so that the memory cells form a page.

20. The integrated circuit according to claim 19, wherein the page is divided into segments, each comprising a subset of memory cells, wherein the control circuit is adapted to cause the change of the logical state of the memory cell to the first logical state or a retainment of the logical state of the memory cell in the first logical state, depending on the logical state of the memory cell read, and cause a change of the logical state of the memory cell to the second logical state or a retainment of the logical state of the memory cell in the first logical state, depending on the logical state to be written, in each of the segments.

21. The integrated circuit according to claim 20, wherein each memory cell or each memory cell of a segment is coupled via a bit line to an associated reading circuit.

22. The integrated circuit according to claim 17, wherein the reading circuit comprises a switch to couple or decouple the memory cell and the associated reading circuit.

23. The integrated circuit according to claim 17, wherein the reading circuit is formed as a sense amplifier.

24. The integrated circuit according to claim 23, wherein the sense amplifier is formed as a current sense amplifier or as a current shift sense amplifier.

25. The integrated circuit according to claim 17, wherein the control circuit comprises an analyzer circuit adapted to provide a signal that depends on the logical state of the memory cell read, and wherein the control circuit is responsive to the signal to decide whether the logical state of the memory cell is to be changed to the first logical state or to be retained in the first logical state.

26. The integrated circuit according to claim 25, wherein the analyzer circuit comprises a comparator circuit to which the logical state of the memory cell read and a reference state representing the first or the second logical state is coupled so as to provide a signal indicating whether the logical state of the memory cell is to be changed to the first logical state or to be retained in the first logical state.

27. The integrated circuit according to claim 17, wherein the reading circuit comprises a buffer adapted to buffer the logical state of the memory cell read upon a connection of the reading circuit with the memory cell, and being overwritable by data to be written to the memory cells during a disconnection from the memory cell.

28. The integrated circuit according to claim 27, wherein the control circuit is adapted to cause the change of the logical state of the memory cell to the second logical state or a retainment the logical state of the memory cell in the first logical state, by causing a re-connection of the memory cell and the reading circuit.

29. The integrated circuit according to claim 17, wherein the memory cell is formed by a resistive element, a magnetic element or a capacitive element.

30. The integrated circuit according to claim 17, wherein the memory cell is formed as a non-volatile memory cell.

31. The integrated circuit according to claim 17, wherein the integrated circuit comprises further a logic circuitry.

32. The integrated circuit according to claim 31, wherein the logic circuitry comprises a data processing unit.

33. The integrated circuit according to claim 31, wherein the logic circuitry comprises a central-processor-unit (CPU) or a digital-signal-processor (DSP).

34. An integrated circuit comprising:
a memory cell able to assume a first and a second logical state, wherein a change from the second logical state to the first logical state lasts longer than a change from the first logical state to the second logical state;
means for reading the logical state of the memory cell;
means for changing, depending on the logical state of the memory cell read, the logical state of the memory cell to the first logical state or retaining the same in the first logical state; and
means for changing the logical state of the memory cell to the second logical state or retaining the same in the first logical state, depending on the logical state to be written.

35. An integrated circuit comprising:
a memory cell able to assume a first and a second logical state, wherein a change from the second logical state to the first logical state lasts longer than a change from the first logical state to the second logical state;
a buffer;
a switch connected between the memory cell and the buffer;
a reading circuit;
a resetting circuit; and
a control circuit configured to cause opening the switch to disconnect the memory cell from the buffer, to read a buffered state from the buffer, to instruct the resetting circuit to change the logical state of the memory cell to the first logical state or retain the same in the first logical state, depending on the buffered state read, to cause changing the logical state of the memory cell to the second logical state or retaining the same in the first logical state, depending on the logical state to be written, and to cause closing the switch to connect the memory cell and the buffer.

36. The integrated circuit according to claim 35, wherein the memory cell is formed by a resistive element, a magnetic element, or a capacitive element.

37. The integrated circuit according to claim 35, further comprising a memory array with memory cells arranged in rows and columns wherein the memory cell comprises one of the memory cells and wherein each memory cell comprises a selection switch via which the memory cells are connectable to the respective reading circuit, the selection switch being controllable via a word line so that the memory cells form a page.

38. The integrated circuit according to claim 37, wherein the page is divided into segments, each comprising a subset of the plurality of memory cells, wherein the control circuit is adapted to cause the change of the logical state of the memory cell to the first logical state or a retainment of the logical state of the memory cell in the first logical state, depending on the logical state of the memory cell read, and cause a change of the logical state of the memory cell to the second logical state or a retainment of the logical state of the memory cell in the first logical state, depending on the logical state to be written, in each of the segments.

39. A data processing system comprising at least one integrated circuit, the integrated circuit comprising:
- a memory cell able to assume a first and a second logical state, wherein a change from the second logical state to the first logical state lasts longer than a change from the first logical state to the second logical state;
- a reading circuit being connectable to the memory cell; and
- a control circuit configured to cause a change of the logical state of the memory cell to the first logical state or a retainment of the logical state of the memory cell in the first logical state, depending on the logical state of the memory cell read, and cause a change of the logical state of the memory cell to the second logical state or a retainment of the logical state of the memory cell in the first logical state, depending on the logical state to be written.

40. The data processing system according to claim 39, further comprises a data processing unit and a memory controller.

41. The data processing system according to claim 40, wherein the data processing unit comprises a central-processor-unit (CPU) or a digital-signal-processor (DSP).

* * * * *